United States Patent
Kim

(10) Patent No.: US 10,170,363 B2
(45) Date of Patent: Jan. 1, 2019

(54) SEMICONDUCTOR DEVICE AND METHOD OF MANUFACTURING THE SEMICONDUCTOR DEVICE

(71) Applicant: SK hynix Inc., Icheon-si Gyeonggi-do (KR)

(72) Inventor: Jong Su Kim, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/651,117

(22) Filed: Jul. 17, 2017

(65) Prior Publication Data

US 2018/0174905 A1 Jun. 21, 2018

(30) Foreign Application Priority Data

Dec. 20, 2016 (KR) .................. 10-2016-0174940

(51) Int. Cl.
| | | |
|---|---|---|
| *H01L 21/76* | (2006.01) | |
| *H01L 21/768* | (2006.01) | |
| *H01L 23/528* | (2006.01) | |
| *H01L 23/538* | (2006.01) | |
| *H01L 23/532* | (2006.01) | |
| *H01L 23/522* | (2006.01) | |

(52) U.S. Cl.
CPC .... *H01L 21/76898* (2013.01); *H01L 23/5223* (2013.01); *H01L 23/5283* (2013.01); *H01L 23/5386* (2013.01); *H01L 23/53204* (2013.01); *H01L 23/53295* (2013.01)

(58) Field of Classification Search
CPC ......... H01L 21/76898; H01L 23/53295; H01L 23/53204; H01L 23/5283; H01L 23/5386
See application file for complete search history.

(56) References Cited

U.S. PATENT DOCUMENTS

2013/0270675 A1* 10/2013 Childs ................ H01L 23/5226
 257/532
2014/0264947 A1* 9/2014 Lin ...................... H01L 21/768
 257/777

FOREIGN PATENT DOCUMENTS

| KR | 100666377 B1 | 1/2007 |
| KR | 1020110001702 A | 1/2011 |

* cited by examiner

*Primary Examiner* — Julia Slutsker

(74) *Attorney, Agent, or Firm* — William Park & Associates Ltd.

(57) ABSTRACT

An interconnection structure of the semiconductor integrated circuit device may be provided. The interconnection structure may include a first conductive pattern, a second conductive pattern, a dielectric layer and a contact part. The first conductive pattern may have a first width and a first length. The second conductive pattern may be formed over the first conductive pattern. The second conductive pattern may have a second width and a second length. The dielectric layer may be interposed between the first conductive pattern and the second conductive pattern. The contact part may be configured to simultaneously make contact with the first conductive pattern and the second conductive pattern.

10 Claims, 8 Drawing Sheets

SEMICONDUCTOR DEVICE AND METHOD OF MANUFACTURING THE SEMICONDUCTOR DEVICE

CROSS-REFERENCES TO RELATED APPLICATION

The present application claims priority under 35 U.S.C. § 119(a) to Korean application number 10-2016-0174940, filed on Dec. 20, 2016, in the Korean Intellectual Property Office, which is incorporated herein by reference in its entirety.

BACKGROUND

1. Technical Field

Various embodiments may generally relate to a semiconductor device and a method of manufacturing the semiconductor device, more particularly, to an interconnection structure of a semiconductor device, and a method of manufacturing the interconnection structure

2. Related Art

When a semiconductor integrated circuit device is highly integrated, a width of each interconnection and gaps between the interconnections electrically connected between elements are remarkably reduced.

An area of the interconnection may be decreased due to the narrow width of the interconnection so that an interconnection resistance may be increased. Further, a coupling capacitance between the interconnections may be increased due to the narrow gaps between the interconnections.

The high interconnection resistances and the high coupling resistances may cause a signal delay characteristic of the interconnection to decrease.

SUMMARY

According to an embodiment, there may be provided an interconnection structure of a semiconductor integrated circuit device. The interconnection structure of the semiconductor integrated circuit device may include a first conductive pattern, a second conductive pattern, a dielectric layer and a contact part. The first conductive pattern may have a first width and a first length. The second conductive pattern may be formed over the first conductive pattern. The second conductive pattern may have a second width and a second length. The dielectric layer may be interposed between the first conductive pattern and the second conductive pattern. The contact part may be configured to simultaneously make contact with the first conductive pattern and the second conductive pattern.

According to an embodiment, there may be provided an interconnection structure of a semiconductor integrated circuit device. The interconnection structure of the semiconductor integrated circuit device may include a first interconnection and a second interconnection. An insulating layer may be interposed between the first interconnection and the second interconnection. The first interconnection and the second interconnection may be extended in parallel to each other. The first and second interconnections may include a dielectric layer and a parasitic capacitor. The dielectric layer may be formed in the first and second interconnections. The parasitic capacitor may be serially connected to a coupling capacitor generated between the first interconnection and the second interconnection.

According to an embodiment, there may be provided a method of manufacturing an interconnection structure of a semiconductor integrated circuit device. In the method of manufacturing the interconnection structure of the semiconductor integrated circuit device, a first conductive layer may be formed on a semiconductor substrate. A surface of the first conductive layer may be treated to form a dielectric layer. A second conductive layer may be formed on the dielectric layer. The second conductive layer and the dielectric layer may be patterned to form a second conductive pattern. The first conductive layer may be patterned to form a first conductive pattern having a length longer than that of the second conductive pattern. A contact part may simultaneously make contact with the first conductive pattern and the second conductive pattern.

According to an embodiment, there may be provided a method of manufacturing an interconnection structure of a semiconductor integrated circuit device. In the method of manufacturing the interconnection structure of the semiconductor integrated circuit device, a first conductive layer may be formed on a semiconductor substrate. A surface of the first conductive layer may be treated to form a dielectric layer. A second conductive layer may be formed on the dielectric layer. The second conductive layer and the dielectric layer may be patterned to form a second conductive pattern. A spacer may be formed on a sidewall of the second conductive pattern. The first conductive layer may be etched using the spacer and the second conductive pattern as an etch mask to form a first conductive pattern. A contact part may simultaneously make contact with the first conductive pattern and the second conductive pattern.

DETAILED DESCRIPTION

Figure 1:
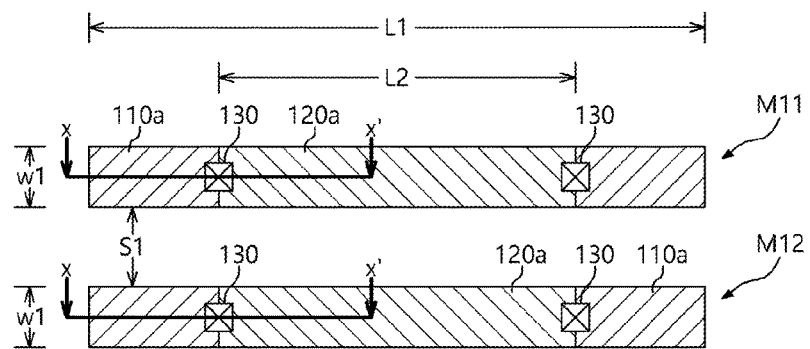
FIG. 1 is a plan view illustrating a pair of interconnection structures in accordance with examples of embodiments.

Various examples of embodiments will be described hereinafter with reference to the accompanying drawings, in which some examples of the embodiments are illustrated. The embodiments may, however, be embodied in many different forms and should not be construed as limited to the examples of embodiments set forth herein. Rather, these examples of embodiments are provided so that this disclosure will be thorough and complete, and will fully convey a scope of the present disclosure to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Spatially relative terms, such as "under," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "under" other elements or features would then be oriented "above" the other elements or features. Thus, the example of the term "below" can encompass both an orientation of above and below. The device may be otherwise oriented (rotated 90 degrees or at other orientations) and the spatially relative descriptors used herein interpreted accordingly.

The terminology used herein is for the purpose of describing particular examples of embodiments only and is not intended to be limiting of the present disclosure. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, examples of the embodiments will be explained with reference to the accompanying drawings.

Figure 2:
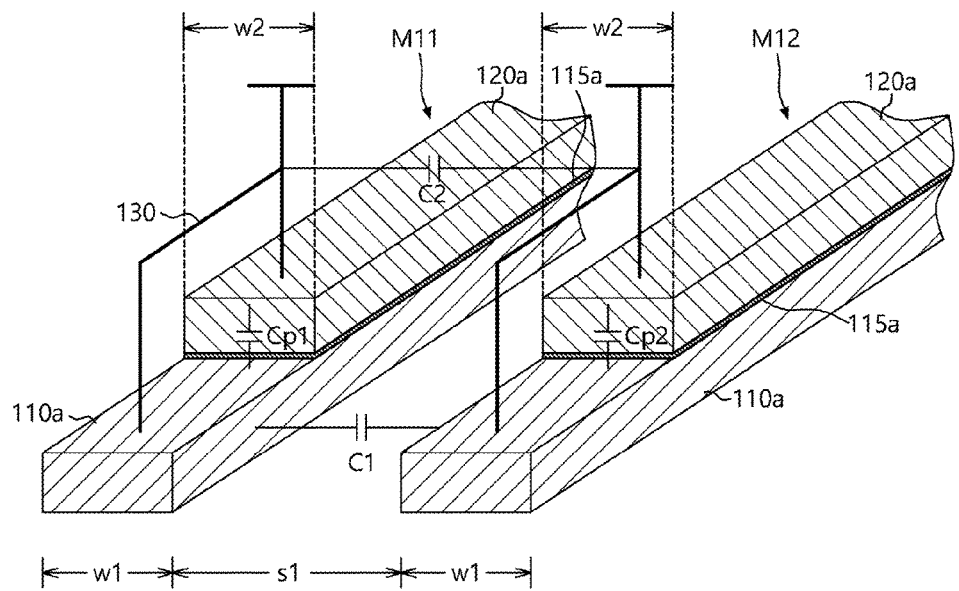
FIG. 2 is a perspective view illustrating the interconnection structures in FIG. 1.
Figure 3:
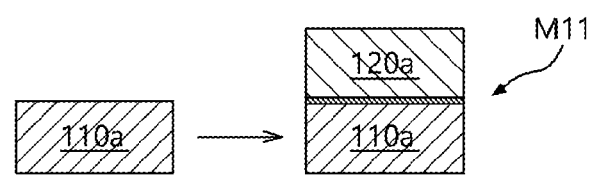
FIG. 3 is a cross-sectional view illustrating cross-sectional areas of a first conductive pattern and a second conductive pattern in an interconnection structure in accordance with examples of embodiments.

FIG. 1 is a plan view illustrating a pair of interconnection structures in accordance with examples of embodiments, and FIG. 2 is a perspective view illustrating the interconnection structures in FIG. 1. FIG. 3 is a cross-sectional view illustrating cross-sectional areas of a first conductive pattern and a second conductive pattern in an interconnection structure in accordance with examples of embodiments.

Referring to FIGS. 1 and 2, a first interconnection M11 and a second interconnection M12 may be extended in parallel or substantially parallel to each other on a plane. For example, the first interconnection M11 and the second interconnection M12 may be extended in parallel to each other on a semiconductor substrate including an insulating layer along one direction. The pair of interconnection structures in accordance with an embodiment, for example, may respectively include a first conductive pattern 110a, a second conductive pattern 120a, a dielectric layer 115a, an insulating interlayer 125, and a contact part 130.

The first interconnection M11 and the second interconnection M12 on the plane may correspond to any one selected from first to nth metal interconnections of a semiconductor integrated circuit device.

The first interconnection M11 and the second interconnection M12 may include a power interconnection or a ground interconnection of the semiconductor integrated circuit device.

The first interconnection M11 and the second interconnection M12 may have substantially the same configuration. Each of the first interconnection M11 and the second interconnection M12 may include first conductive pattern 110a, a dielectric layer 115a and a second conductive pattern 120a sequentially stacked.

The first conductive pattern 110a may have a first width w1 and a first length L1. The first interconnection M11 and the second interconnection M12 may be spaced apart from each other by a gap s1.

The first width w1 and the gap s1 may correspond to a pitch range considered an integration degree of the semiconductor integrated circuit device. The first width w1 and the gap s1 may correspond to a minimum width and a minimum gap, respectively.

The second conductive pattern 120a may be formed over the first conductive pattern 110a. The second conductive pattern 120a may have a second width w2 substantially the same as the first width w1 of the first conductive pattern 110a. The second conductive pattern 120a may have a second length L2 shorter than the first length L1. The second conductive pattern 120a may be formed at a position configured to expose both ends of the first conductive pattern 110a. In an embodiment, for example, the second conductive pattern 120a is configured to expose an edge portion 111a of the first conductive pattern 110a, and the contact part 130 is configured to make contact with the an edge portion 121a of the second conductive pattern 120a and the exposed edge portion 111a of the first conductive pattern 110a.

The dielectric layer 115a may be interposed between the first conductive pattern 110a and the second conductive pattern 120a. The dielectric layer 115a may include a conductive oxide layer, a conductive nitride layer, a conductive oxynitride layer, etc. The first conductive pattern 110a and the second conductive pattern 120a may be simultaneously connected with one contact part 130 to receive a same signal (voltage). In an embodiment, for example, a contact part 130 may be configured to simultaneously make contact with the first conductive pattern 110a and the second conductive pattern 120a.

The first interconnection M11 and the second interconnection M12 may have a uniform thickness. The first interconnection M11 and the second interconnection M12 may include the first conductive pattern 110a and the second conductive pattern 120a configured to receive the same voltage or signal so that the thickness of the first and second interconnections M11 and M12 may be increased compared to an interconnection having only one conductive pattern.

Referring to FIG. 3, a cross-sectional area of the first and second interconnections M11 and M12 may be increased by a cross-sectional area of the second conductive pattern 120a. Because a resistance of an interconnection may be inversely proportional to a cross-sectional area of the interconnection, an interconnection resistance may be reduced by stacking the second conductive pattern 120a over the first conductive pattern 110a.

Figure 4:
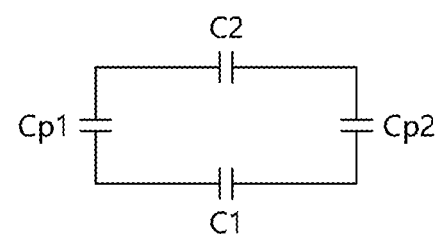
FIG. 4 is an equivalent circuit diagram illustrating the interconnection structure in FIGS. 1 and 2.

FIG. 4 is an equivalent circuit diagram of FIG. 1 or FIG. 2 for illustrating the interconnection structures in FIGS. 1 and 2.

Referring to FIG. 4, a first coupling capacitor C1 may be generated between the first interconnection M11 and the second interconnection M12. Because the first and second interconnections M11 and M12 may include the first and second conductive patterns 110a and 120a, the coupling capacitance may be increased due to increasing of the cross-sectional area. The first coupling capacitor C1 may be serially connected between a first parasitic capacitor Cp1 between the first and second conductive patterns 110a and 120a in the first interconnection M11, a second parasitic capacitor Cp2 between the first and second conductive patterns 110a and 120a in the second interconnection M12, and a second coupling capacitor C2 generated between the adjacent contact parts 130. Thus, a total effective coupling capacitance between the first interconnection M11 and the second interconnection M12 may be substantially decreased.

That is, because the first and second parasitic capacitors Cp1 and Cp2 may be generated in the first interconnection M11 and the second interconnection M12, the first capacitor C1 and the second capacitor C2 construed as a parallel structure may be converted into a serial structure by the first and second parasitic capacitors Cp1 and Cp2.

FIGS. 5 to 10 are cross-sectional views illustrating a method of manufacturing an interconnection structure in accordance with examples of embodiments. FIGS. 5 to 10 are cross-sectional views taken along a line x-x' in FIG. 1.

Figure 5:
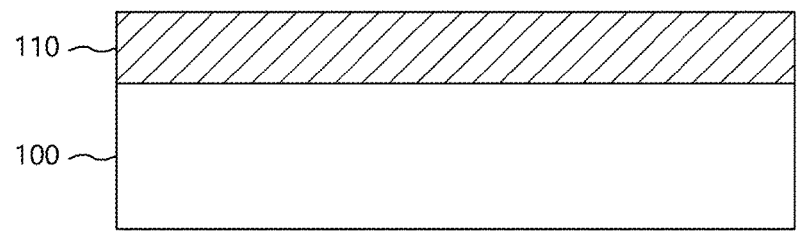
FIGS. 5 to 10 are cross-sectional views illustrating a method of manufacturing an interconnection structure in accordance with examples of embodiments.

Referring to FIG. 5, a first conductive layer 110 may be formed on a semiconductor substrate 100. The semiconductor substrate 100 may include a circuit and an insulating layer. The first conductive layer 110 may include a metal layer. Alternatively, the first conductive layer 110 may include a polysilicon layer doped with conductive dopants.

Figure 6:
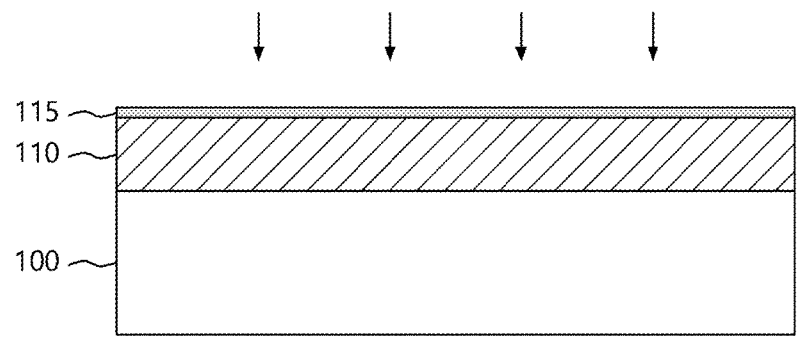

Referring to FIG. 6, a dielectric layer 115 may be formed on the first conductive layer 110. The dielectric layer 115 may be formed on the first conductive layer 110 by a nitrogen (N) treatment process or an argon (Ar) treatment process. When the first conductive layer 110 may include the metal layer or the polysilicon layer with the conductive dopants, the dielectric layer 115 may include a metal oxide layer, a metal nitride layer, a metal oxynitride layer, a silicon nitride layer, a silicon oxide layer, a silicon oxynitride layer, etc.

Figure 7:
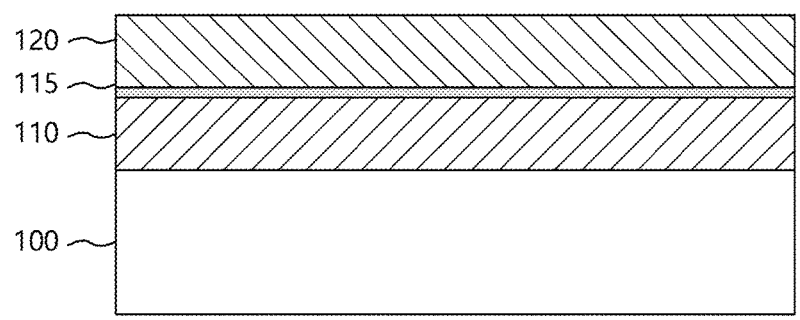

Referring to FIG. 7, a second conductive layer 120 may be formed on the dielectric layer 115. The second conductive layer 120 may include a metal layer or a semiconductor layer having a signal transmission characteristic. The second conductive layer 120 may include a material substantially the same as that of the first conductive layer 110.

Figure 8:
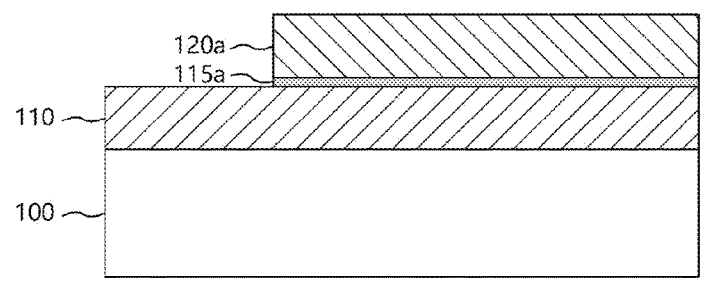

Referring to FIG. 8, the second conductive layer 120 and the dielectric layer 115 may be patterned to form the second conductive pattern 120a and dielectric layer 115a both having the second width w2 and the second length L2.

Figure 9:
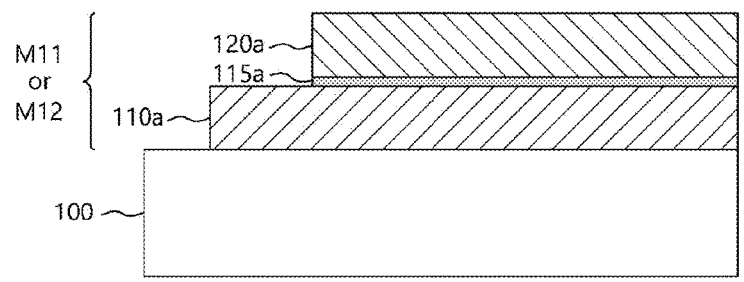

Referring to FIG. 9, the first conductive layer 110 may be patterned to form the first conductive pattern 110a having the first width w1 and the first length L1. The second conductive pattern 120a may be positioned over the first conductive pattern 110a to expose any one of the both ends of the first conductive pattern 110a to form the first interconnection M11 or the second interconnection M12.

Figure 10:
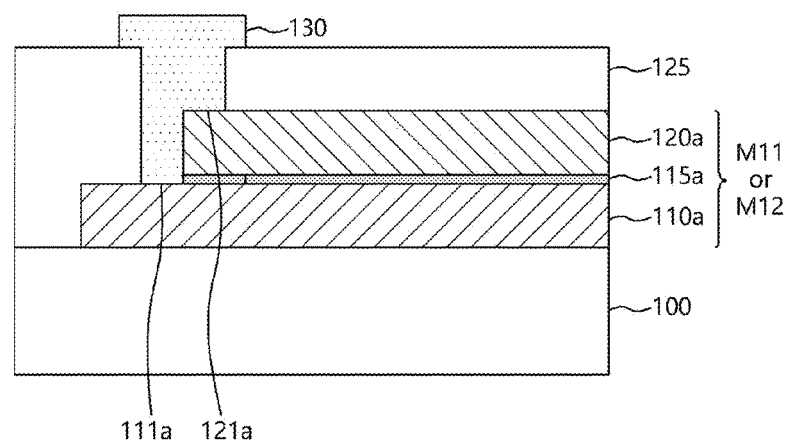

Referring to FIG. 10, an insulating interlayer 125 may be formed on the first interconnection M11 or the second interconnection M12. The insulating interlayer 125 may be etched to form a contact hole configured to simultaneously expose the first conductive pattern 110a and the second conductive pattern 120a. The contact hole may be configured to simultaneously expose an end of the second conductive pattern 120a and a portion of the first conductive pattern 110a adjacent to the end of the second conductive pattern 120a. The contact hole may be filled with a conductive material to form the contact part 130.

A same signal may be applied to the first conductive pattern 110a and the second conductive pattern 120a through the contact part 130. Thus, the stacked first and second conductive patterns 110a and 120a may be recognized as a single interconnection. Further, the dielectric layer 115a may be interposed between the first conductive pattern 110a and the second conductive pattern 120a. The parasitic capacitors Cp1 and Cp2 may be generated in the first interconnection M11 or the second interconnection M12 due to a slight signal delay between the first conductive pattern 110a and the second conductive pattern 120a. The parasitic capacitors Cp1 and Cp2 may function to serially connect the coupling capacitors C1 and C2 with each other generated between the first and second interconnections M11 and M12 in view of an equivalent circuit. Therefore, the effective coupling capacitance between the interconnections M11 and M12 may be lower than a total capacitance of coupling capacitors parallelly connected with each other. As a result, a signal delay of the interconnection may be decreased.

Figure 11:
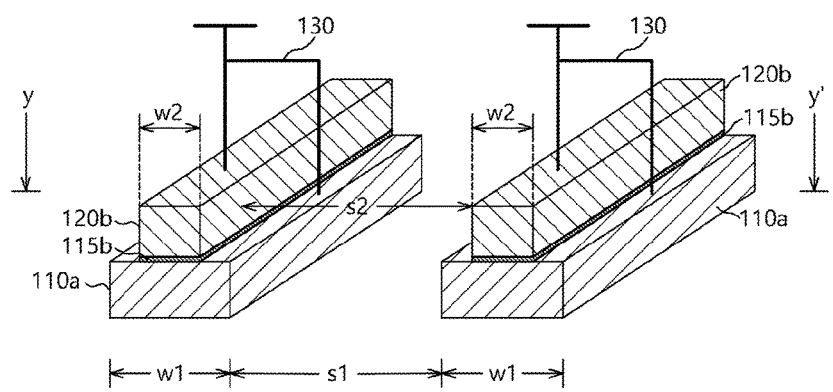
FIG. 11 is a perspective view illustrating an interconnection structure in accordance with examples of embodiments.
Figure 12:
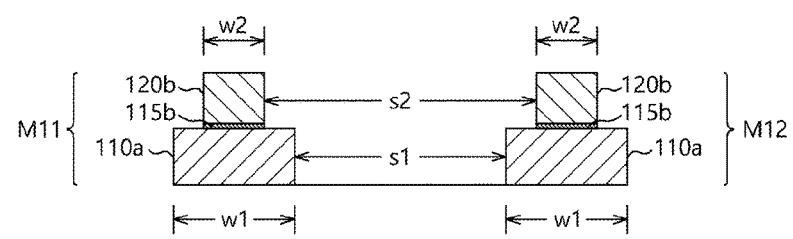
FIG. 12 is a cross-sectional view illustrating the interconnection structure in FIG. 11.

FIG. 11 is a perspective view illustrating interconnection structures in accordance with examples of embodiments, and FIG. 12 is a cross-sectional view illustrating the interconnection structures in FIG. 11.

Referring to FIGS. 11 and 12, a first interconnection M11 or a second interconnection M12 may include a first conductive pattern 110a and a second conductive pattern 120b. The first conductive pattern 110a may have a first width w1 different from a second width w2 of the second conductive pattern 120b. The pair of interconnection structures in accordance with an embodiment, for example, may respectively include a first conductive pattern 110a, a second conductive pattern 120b, a dielectric layer 115b, and a contact part 130.

The first conductive pattern 110a may be formed on a semiconductor substrate. The first conductive patterns 110a in the first and second interconnections M11 and M12 may have the first width. The first conductive patterns 110a may be arranged in parallel to each other or substantially parallel to each other. The first conductive patterns 110a may be spaced apart from each other by a first gap s1. The first width w1 and the first gap s1 may correspond to an interconnection pitch of a semiconductor integrated circuit device.

Each of the second conductive patterns 120b may be formed on the first conductive patterns 110a. The second width w2 of the second conductive pattern 120b may be narrower than the first width w1 of the first conductive pattern 110a. The second conductive patterns 120b may be spaced apart from each other by a second gap s2 wider than the first gap s1. The second conductive pattern 120b may have a length substantially the same as that of the first conductive pattern 110a.

A dielectric layer 115b may be interposed between the first conductive pattern 110a and the second conductive pattern 120b. A contact part 130 may be configured to simultaneously make contact with the first conductive pattern 110a and the second conductive pattern 120b.

In examples of embodiments, the second conductive pattern 120b having the second width w2 may be positioned over the first conductive pattern 110a having the first width w1 so that each of the first and second interconnections M11 and M12 may have a cross-sectional area increased by a cross-sectional area of the second conductive pattern 120b compared to a single conductive pattern. As a result, an interconnection resistance may be reduced.

Further, because the second gap s2 between the second conductive patterns 120b may be wider than the first gap s1 between the first conductive patterns 110a, an effective gap between the first interconnection M11 and the second interconnection M12 may be wider than the first gap s1 and narrower than the second gap s2. That is, the effective gap between the first interconnection M11 and the second interconnection M12 may be increased compared to a conventional art. The effective gap may be construed as a thickness of a dielectric layer for determining a capacitance so that an effective coupling capacitance may also be decreased.

Similarly, the first coupling capacitor C1 between the first and second interconnections M11 and M12, the first and second parasitic capacitors Cp1 and Cp2 in the first and second interconnections M11 and M12, and the second coupling capacitor C2 between the contact parts 130 may be serially connected with each other so that the effective coupling capacitance of the first and second interconnections M11 and M12 may be remarkably reduced.

Figure 13:
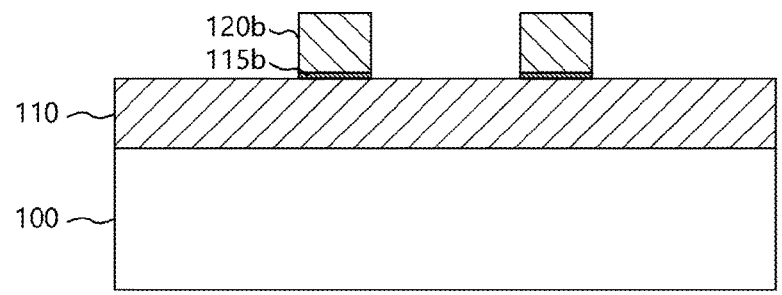
FIGS. 13 to 17 are cross-sectional views illustrating a method of manufacturing an interconnection structure in accordance with examples of embodiments.
Figure 15:
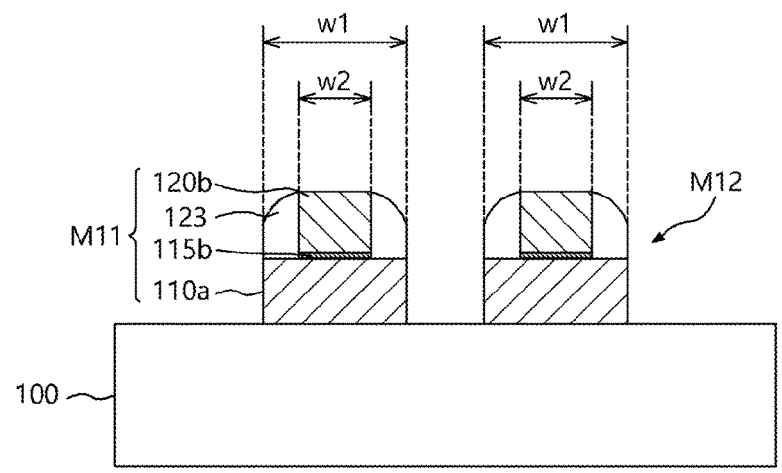
Figure 16:
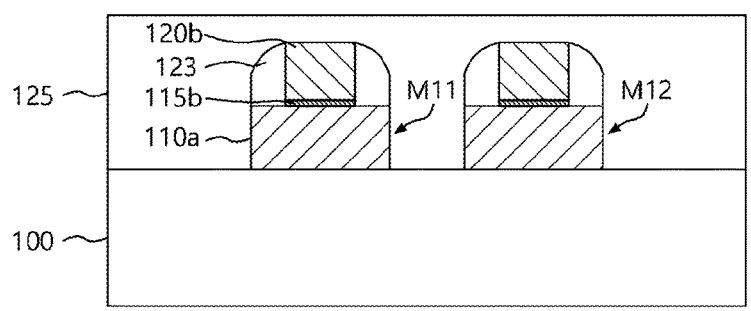
Figure 17:
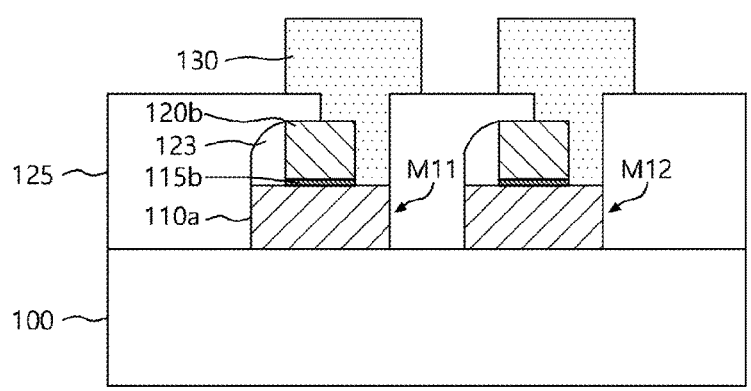

FIGS. 13 to 17 are cross-sectional views illustrating a method of manufacturing an interconnection structure in accordance with examples of embodiments. FIGS. 13 and 17 are cross-sectional views taken along a line y-y' in FIG. 11.

Processes illustrated with reference to FIGS. 5 to 7 may be performed to sequentially form a first conductive layer 110, a dielectric layer 115 and a second conductive layer 120 on a semiconductor substrate 100.

Referring to FIG. 13, the second conductive layer 120 may be etched to form the second conductive pattern 120b having the second width w2. The second width w2 of the second conductive pattern 120b may be narrower than a width (for example, minimum feature size) required in the semiconductor integrated circuit device. The second conductive pattern 120b may be formed by a double patterning process, a quadruple patterning process, etc. The dielectric layer 115 exposed through the second conductive pattern 120b may then be etched.

Figure 14:
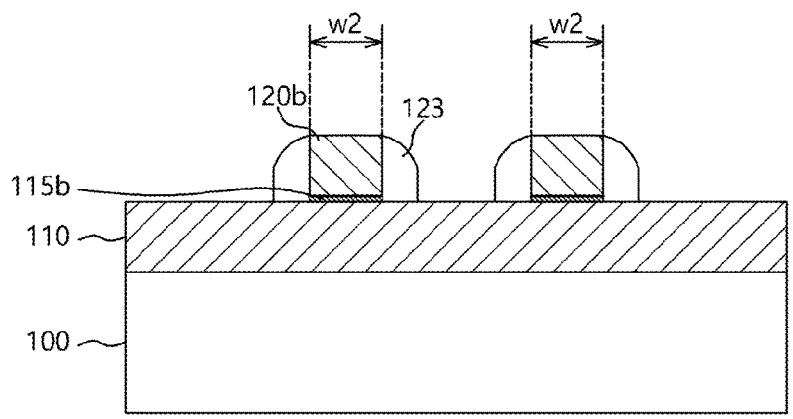

Referring to FIG. 14, an insulating layer may be formed on the first conductive layer 110 and the second conductive pattern 120b. The insulating layer may be anisotropically etched to form a spacer 123 on a sidewall of the second conductive pattern 120b. A thickness of the insulating layer may be controlled to provide a total width of the second width of the second conductive pattern 120b and a width of the spacer 123 with the first width w1.

Referring to FIG. 15, the first conductive layer 110 may be etched using the second conductive pattern 120b and the spacer 123 as an etch mask to form the first conductive pattern 110a, thereby forming the first and second interconnections M11 and M12 on the semiconductor substrate 100.

Referring to FIG. 16, an insulating interlayer 125 may be formed on the semiconductor substrate 100 having the first and second interconnections M11 and M12.

Referring to FIG. 17, the insulating interlayer may be etched to form a contact hole configured to expose the first and second interconnections M11 and M12. The contact hole may be configured to simultaneously expose the first and second conductive patterns 110a and 120b in the first and second interconnections M11 and M12. The contact hole may be filled with a conductive material to form the contact 130. The pair of interconnection structures in accordance with an embodiment, for example, may respectively include a first conductive pattern 110a, a second conductive pattern 120b, a dielectric layer 115b, a spacer 123, and a contact part 130 In examples of embodiments, the interconnection structure including the multi-conductive layer having different widths may be formed by the single mask process using the spacer.

Figure 18:
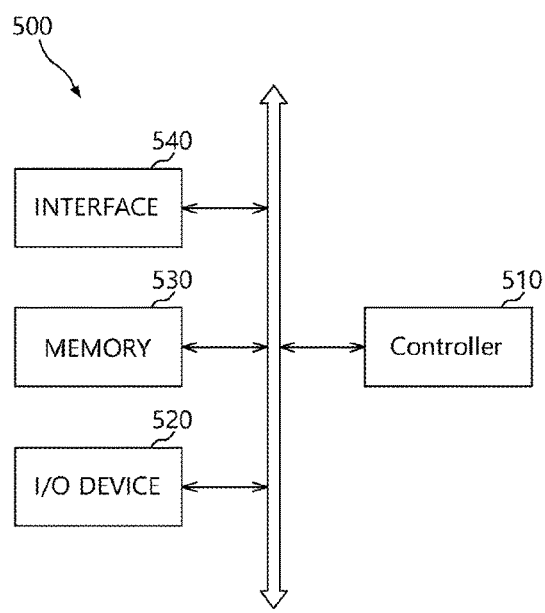
FIG. 18 is a block diagram illustrating an electronic device with one or more integrated circuits (chips) including one or more interconnections.

FIG. 18 is a block diagram illustrating an electronic device with one or more integrated circuits (chips) including one or more interconnections.

Referring to FIG. 18, an electronic device 500 may be used in, but not limited to, a computing device, a personal digital assistant (PDA), a laptop computer, a mobile computer, a web tablet, a wireless phone, a cellular phone, a smart phone, a digital music player or a wire or wireless electronic device. The electronic device 500 may include a controller 510, an input and output (input/output) (I/O) device 520 such as, but not limited to, a keypad, a keyboard, a display, or a touch-screen display, a memory 530, and an interface 540 that may be coupled to each other through a bus 550.

The controller 510 may include, for example, at least one micro-processor, at least one digital signal processor, at least one micro-controller, or the like. The memory 530 may be configured to store a command code to be used by the controller 510 or a user data. The electronic device 500 and the various system components including the electronic device 500 may include one or more integrated circuits (chips). The electronic device 500 may use the interface 540 which may be, for example but not limited to, a wireless interface configured to transmit data to or receive data from a wireless communication network using an RF signal. The interface 540 may include, for example, an antenna, a wireless transceiver and so on.

The electronic device 500 may be used in a communication interface protocol of a communication system, such as, but not limited to, Code Division Multiple Access (CDMA), Global System for Mobile Communications (GSM), North American Digital Communications (NADC), Extended Time Division Multiple Access (E-TDMA), Wideband CDMA (WCDMA), CDMA2000, Wi-Fi, Municipal Wi-Fi (Muni Wi-Fi), Bluetooth, Digital Enhanced Cordless Telecommunications (DECT), Wireless Universal Serial Bus (Wireless USB), Fast low-latency access with seamless handoff Orthogonal Frequency Division Multiplexing (Flash-OFDM), IEEE 802.20, General Packet Radio Service (GPRS), iBurst, Wireless BroadBand (WiBro), WiMMX, WiMMX-Advanced, Universal Mobile Telecommunication Service-Time Division Duplex (UMTS-TDD), High Speed Packet Access (HSPA), Evolution Data Optimized (EVDO), Long Term Evolution-Advanced (LTE-Advanced), Multi-channel Multipoint Distribution Service (MMDS), and so forth.

Figure 19:
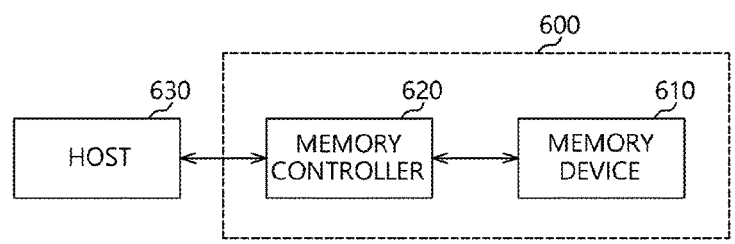
FIG. 19 is a block diagram illustrating a memory system with one or more integrated circuits (chips) including one or more interconnections.

FIG. 19 is a block diagram illustrating a memory system with one or more integrated circuits (chips) including one or more interconnections.

Referring to FIG. 19, a memory system 600 may include a memory device 610 for storing large amounts of data and a memory controller 620. The memory controller 620 may control the memory device 610 to read data stored in the memory device 610 or to write data into the memory device 610 in response to a read and write (read/write) request of a host 630. The memory controller 620 may include an address-mapping table for mapping an address provided from the host 630 (e.g., a mobile device or a computer system) into a physical address of the memory device 610. The memory device 610 may include one or more semiconductor integrated circuit devices having the one or more interconnections.

The above embodiments of the present disclosure are illustrative and not limitative. Various alternatives and equivalents are possible. The examples of the embodiments are not limited by the embodiments described herein. Nor is the present disclosure limited to any specific type of semiconductor device. Other additions, subtractions, or modifications are obvious in view of the present disclosure and are intended to fall within the scope of the appended claims.

What is claimed is:

1. An interconnection structure of a semiconductor integrated circuit device comprising:
   a first conductive pattern having a first width and a first length;
   a second conductive pattern arranged over the first conductive pattern, the second conductive pattern having a second width and a second length being different from the first length;
   a dielectric layer interposed between the first conductive pattern and the second conductive pattern; and
   a contact part configured to simultaneously make contact with the first conductive pattern and the second conductive pattern,
   wherein the second conductive pattern is configured to expose an edge portion of the first conductive pattern, and the contact part is configured to make contact with the an edge portion of the second conductive pattern and the exposed edge portion of the first conductive pattern.

2. The interconnection structure of the semiconductor integrated circuit device of claim 1, wherein the first length is longer than the second length.

3. The interconnection structure of the semiconductor integrated circuit device of claim 2, wherein the first width is substantially the same as the second width.

4. The interconnection structure of the semiconductor integrated circuit device of claim 1, wherein the first width is wider than the second width.

5. The interconnection structure of the semiconductor integrated circuit device of claim 4, wherein the first length is substantially the same as the second length.

6. The interconnection structure of the semiconductor integrated circuit device of claim 4, wherein the contact part is configured to make contact with a sidewall of the second conductive pattern and a portion of the first conductive pattern exposed through the second conductive pattern.

7. Interconnection structures of a semiconductor integrated circuit device comprising:
   a first interconnection;
   a second interconnection extended in parallel to the first interconnection; and
   an insulating layer interposed between the first interconnection and the second interconnection,
   wherein each of the first and second interconnection comprises a dielectric layer formed in the first and second interconnections and a capacitor connected to a coupling capacitor generated between the first interconnection and the second interconnection in series,
   wherein each of the first and second interconnections comprises:
      a first conductive pattern having a first width and a first length;
      a second conductive pattern formed over the first conductive pattern, the second conductive pattern having a second width substantially the same as the first width and a second length shorter than the first length; and
      a dielectric layer interposed between the first conductive pattern and the second conductive pattern,
   wherein each of the interconnection structures, respectively, further comprise:
   a contact part configured to simultaneously make contact with the first conductive pattern and the second conductive pattern, and
   wherein the second conductive patterns are, respectively, configured to expose an edge portions of the first conductive pattern, and the contact parts are, respectively, configured to make contact with an edge portion of the second conductive pattern and the exposed edge portion of the first conductive pattern.

8. The interconnection structures of the semiconductor integrated circuit device of claim 7,
   wherein each of the first and second interconnections comprises:
      a first conductive pattern having a first width and a first length;
      a second conductive pattern arranged over the first conductive pattern, the second conductive pattern having a second width narrower than the first width and a second length substantially the same as the first length; and
      a dielectric layer interposed between the first conductive pattern and the second conductive pattern; and
   wherein each of the interconnection structures, respectively, further comprise:
   a contact part configured to simultaneously make contact with the first conductive pattern and the second conductive pattern.

9. The interconnection structures of the semiconductor integrated circuit device of claim 8, wherein the contact parts are, respectively, configured to make contact with a sidewall of the second conductive pattern and a portion of the first conductive pattern exposed through the second conductive pattern.

10. The interconnection structures of the semiconductor integrated circuit device of claim 8, wherein the first conductive pattern in the first interconnection is spaced apart from the first conductive pattern in the second interconnection by a first gap, and the second conductive pattern in the first interconnection is spaced apart from the second conductive pattern in the second interconnection by a second gap wider than the first gap.

* * * * *